(12) United States Patent
Eom

(10) Patent No.: US 7,008,480 B2
(45) Date of Patent: Mar. 7, 2006

(54) APPARATUS FOR COATING PHOTORESIST

(75) Inventor: Jae Doo Eom, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/888,451

(22) Filed: Jul. 9, 2004

(65) Prior Publication Data
US 2005/0241572 A1  Nov. 3, 2005

(30) Foreign Application Priority Data
May 3, 2004  (KR) .................. 10-2004-0031105

(51) Int. Cl.
B05C 11/02  (2006.01)
(52) U.S. Cl. .............. 118/52; 118/612; 118/319; 118/320
(58) Field of Classification Search ............ 118/52, 118/612, 319, 312, 300, 326, 320
See application file for complete search history.

(56) References Cited

U.S. PATENT DOCUMENTS

| 3,389,682 | A | * | 6/1968 | Gardner | 118/52 |
| 4,894,260 | A | * | 1/1990 | Kumasaka et al. | 427/241 |
| 5,678,116 | A | * | 10/1997 | Sugimoto et al. | 396/611 |
| 6,284,044 | B1 | * | 9/2001 | Sakamoto et al. | 118/219 |
| 6,689,419 | B1 | * | 2/2004 | Itou | 427/240 |
| 6,743,722 | B1 | * | 6/2004 | Kassir | 438/690 |
| 2003/0209259 | A1 | * | 11/2003 | Tung et al. | 134/18 |
| 2004/0060582 | A1 | * | 4/2004 | Sasaki et al. | 134/61 |

* cited by examiner

Primary Examiner—Chris Fiorilla
Assistant Examiner—Yewebdar Tadesse
(74) Attorney, Agent, or Firm—Ladas & Parry LLP

(57) ABSTRACT

Disclosed is a photoresist coating apparatus capable of preventing a substrate from being contaminated and preventing a pattern bridge phenomenon from being created in the substrate during an exposure process by shielding back-flow of photoresist through forcibly exhausting photoresist to an exterior. The photoresist coating apparatus includes a vacuum chuck for holding a substrate by using vacuum, a driving motor connected to the vacuum chuck through an arm, a first nozzle for coating photoresist onto the substrate, a second nozzle for performing a rinse process, a bath surrounding the vacuum chuck to prevent photoresist from being discharged to an exterior, a first drain pipe connected to both lower ends of the bath in order to discharge photoresist contained in the bath, and a photoresist discharge section for forcibly discharging photoresist contained in the bath to the exterior.

6 Claims, 4 Drawing Sheets

APPARATUS FOR COATING PHOTORESIST

BACKGROUND OF THE INVENTION

1. Field of the Invention

The present invention relates to a semiconductor device, and more particularly to an apparatus for coating photoresist capable of preventing photoresist, which is introduced into a drain pipe when photoresist is coated on an upper surface of a substrate formed with devices, from flowing backward, thereby preventing a rear surface of the semiconductor substrate, which is opposite to the upper surface formed with devices, from being contaminated.

2. Description of the Prior Art

Generally, in order to fabricate IC semiconductor devices, liquid crystal display devices, and plasma display devices, it is necessary to form a predetermined material pattern on a semiconductor substrate (wafer) or a glass substrate. To this end, after coating photoresist on an entire upper surface of a material layer formed on the semiconductor substrate or the glass substrate, the photoresist is exposed and developed, thereby forming a photoresist pattern. Then, the material layer is etched by using the photoresist pattern as a mask, thereby forming a material layer pattern. A photoresist coating apparatus is used for coating the photoresist on the semiconductor substrate or the glass substrate. Hereinafter, a conventional photoresist coating apparatus will be described with reference to FIG. 1.

FIG. 1 is a schematic sectional view of a conventional photoresist coating apparatus.

As shown in FIG. 1, the conventional photoresist coating apparatus includes a vacuum chuck 15 capable of gripping a substrate 13, such as a semiconductor substrate or a glass substrate, by using vacuum, a driving motor 19 connected to the vacuum chuck 15 through an arm 17 in order to rotate the substrate 13 at a high speed, a first nozzle 23 installed above the vacuum chuck 15 in order to coat photoresist 21 onto the substrate 13, a second nozzle 25 installed below the vacuum chuck 15 in order to perform a rinse process with respect to a rear surface of the substrate 13, and a bath 11 surrounding the vacuum chuck 15 including the substrate 13 in order to prevent photoresist 21 which has fallen down from the substrate 13 from being discharged to an exterior.

When performing the photoresist coating process by using the conventional photoresist coating apparatus having the above construction, the substrate 13 is firstly loaded on the vacuum chuck 15. Then, photoresist 21 is coated on a surface of the substrate 13 through the first nozzle 23. At this time, since the vacuum chuck 15 is formed with a plurality of fine vacuum holes (not shown), vacuum force is applied to the substrate 13 through the fine vacuum holes when photoresist 21 is coated on the upper surface of the substrate, so that the substrate 13 is fixedly maintained on the vacuum chuck 15.

After that, the substrate 13 loaded on the vacuum chuck 15 is rotated at a predetermined speed by using the driving motor 19 and the arm 17, so that photoresist 21 is evenly coated on the upper surface of the substrate 13 due to centrifugal force applied thereto. At this time, since a lower end portion of the bath 11 is connected to an exhaust pipe (not shown), photoresist contained in the bath 11 is exhausted to an exterior through the exhaust pipe.

In addition, a rinsing solution is fed to the rear surface of the substrate through the second nozzle 25, so photoresist which has dropped from the upper surface of the substrate 13 and attached to the rear surface of the substrate 13 due to the rotation of the vacuum chuck 15 can be removed from the rear surface of the substrate 13.

FIGS. 2 and 3 are photographic views representing problems of prior arts. FIG. 2 shows an annular pattern formed at the rear surface of the substrate, and FIG. 3 shows a pattern bridge phenomenon created in the substrate.

When the vacuum chuck is rotated at a high speed after photoresist has been coated on the substrate, photoresist including volatile component must be exhausted to the exterior through the drain pipe connected to the lower end portion of the bath. However, according to the prior art, a swirl flow is created due to high-speed rotation and vacuum characteristics, so photoresist introduced into the drain pipe is not exhausted to the exterior, but flows backward so that photoresist is attached to a predetermined portion of the substrate, that is, attached to the rear surface of the substrate, thereby contaminating the rear surface of the substrate. The photoresist attached to the rear surface of the substrate may act as a contamination source, causing defects in the substrate. Such defect may include an annular pattern formed around a vacuum hole as shown in FIG. 2.

Therefore, when an exposure process is carried out with respect to the substrate by moving the substrate having the contaminated rear surface into a stage of exposure equipment, the stage may be contaminated, so that a focus error is generated when forming a pattern on the substrate. Thus, as shown in FIG. 3, a pattern bridge phenomenon may occur in the substrate, causing defects in the substrate.

SUMMARY OF THE INVENTION

Accordingly, the present invention has been made to solve the above-mentioned problems occurring in the prior art, and an object of the present invention is to provide a photoresist coating apparatus capable of preventing a rear surface of the substrate from being contaminated and preventing a pattern bridge phenomenon from being created in the substrate during an exposure process by shielding backflow of photoresist through forcibly exhausting photoresist contained in a bath to an exterior.

In order to accomplish the object, according to a first aspect of the present invention, there is provided an apparatus for coating photoresist on a surface of a substrate during a semiconductor device manufacturing process, the apparatus comprising: a vacuum chuck capable of holding a substrate thereon by using vacuum; a driving motor connected to the vacuum chuck through an arm in order to supply rotational driving force to the substrate; a first nozzle installed above the vacuum chuck in order to coat photoresist onto the substrate; a second nozzle installed below the vacuum chuck in order to perform a rinse process with respect to a rear surface of the substrate; a bath surrounding the vacuum chuck including the substrate in order to prevent photoresist from being discharged to an exterior; a first drain pipe connected to both lower ends of the bath in order to discharge photoresist contained in the bath; and a photoresist discharge section for forcibly discharging photoresist contained in the bath to the exterior.

According to the preferred embodiment of the present invention, the photoresist discharge section includes a storage tank connected to the first drain pipe in order to temporarily store photoresist introduced into the bath, a second drain pipe connected to a lower end of the storage tank, and first and second shut-off valves for opening/closing the first and second drain pipes.

The opening/closing operation of the first shut-off valve is controlled by means of a synchronized signal created according to a rotation of the vacuum chuck.

The photoresist discharge section includes a rotating member in a form of a vane coupled with the arm, and the rotating member is simultaneously rotated as arm rotates while developing wings thereof at a predetermined angle so that photoresist contained in the bath is forcibly discharged to the drain pipe.

The wings of the rotating member are developed at an angle of about 15 to 60°.

The second nozzle includes a spray-type nozzle.

In order to accomplish the object, according to a second aspect of the present invention, there is provided an apparatus for coating photoresist on a surface of a substrate during a semiconductor device manufacturing process, the apparatus comprising: a vacuum chuck capable of holding a substrate thereon by using vacuum; a driving motor connected to the vacuum chuck through an arm in order to supply rotational driving force to the substrate; a first nozzle installed above the vacuum chuck in order to coat photoresist onto the substrate; a second nozzle installed below the vacuum chuck in order to perform a rinse process with respect to a rear surface of the substrate; a bath surrounding the vacuum chuck including the substrate in order to prevent photoresist from being discharged to an exterior; a first drain pipe connected to both lower ends of the bath in order to discharge photoresist contained in the bath; a storage tank connected to the first drain pipe in order to temporarily store photoresist introduced into the bath; a second drain pipe connected to a lower end of the storage tank; and first and second shut-off valves for opening/closing the first and second drain pipes.

The opening/closing operation of the first shut-off valve is controlled by means of a synchronized signal created according to a rotation of the vacuum chuck. The second nozzle includes a spray-type nozzle.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
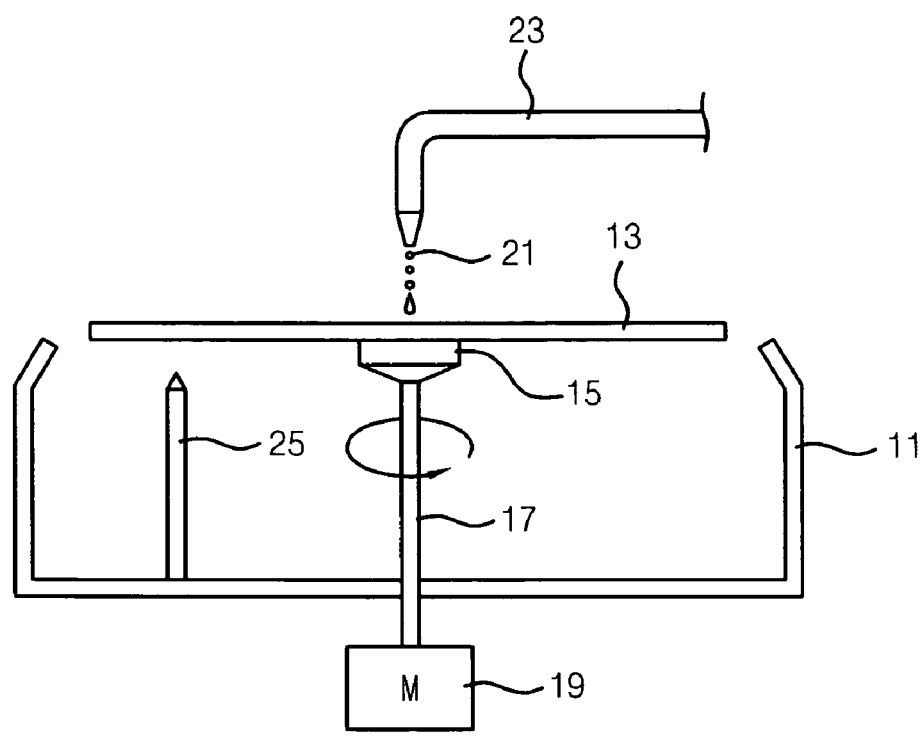
FIG. 1 is a schematic sectional view of a conventional photoresist coating apparatus.
Figure 2:
FIGS. 2 and 3 are views for explaining problems of a prior art.
Figure 3:
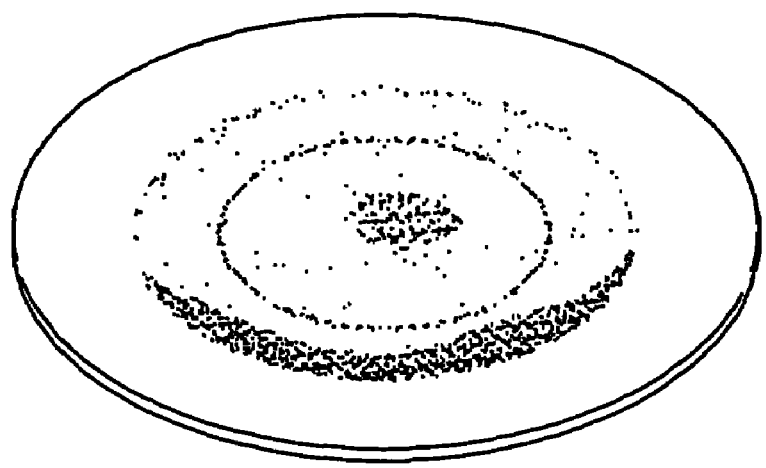

Hereinafter, a photoresist coating apparatus according to a preferred embodiment of the present invention will be described with reference to the accompanying drawings. In the following description and drawings, the same reference numerals are used to designate the same or similar components, and so repetition of the description on the same or similar components will be omitted.

Figure 5:
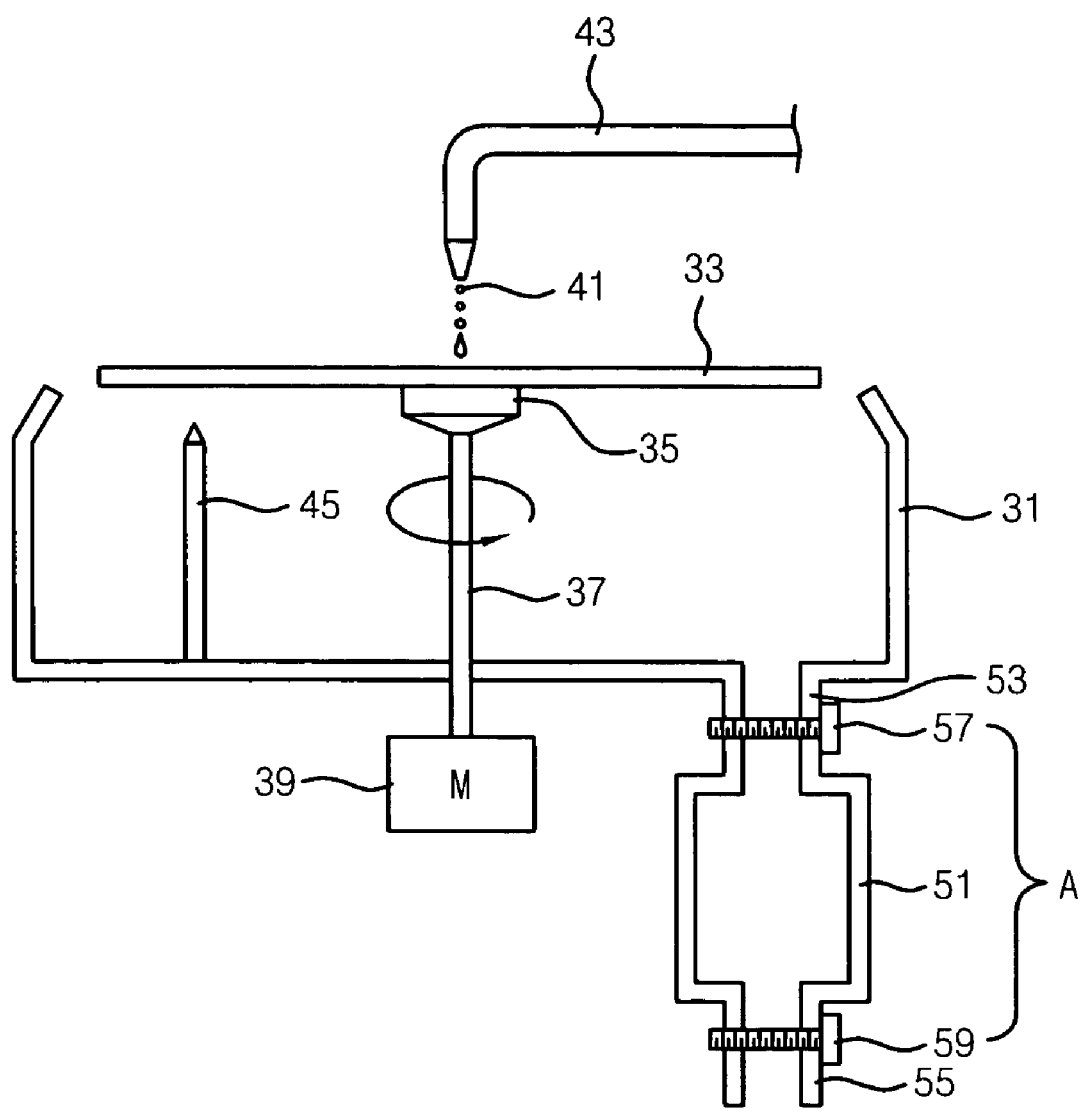
FIG. 5 is a schematic view showing a photoresist coating apparatus according to another embodiment of the present invention.

FIG. 5 is a schematic view showing a photoresist coating apparatus according to one embodiment of the present invention.

As shown in FIG. 5, the photoresist coating apparatus according to one embodiment of the present invention includes a vacuum chuck 35 capable of holding a substrate 33 by using vacuum, a driving motor 39 connected to the vacuum chuck 35 through an arm 37 in order to supply rotational driving force to the substrate 33, a first nozzle 43 installed above the vacuum chuck 35 in order to coat photoresist 41 onto the substrate 33, a spray-type second nozzle 45 installed below the vacuum chuck 35 in order to perform a rinse process with respect to a rear surface of the substrate 33, a bath 31 surrounding the vacuum chuck 35 including the substrate 33 in order to prevent photoresist 41 from being discharged to an exterior, and a photoresist discharge section A connected to a lower end of the bath 31 in order to forcibly discharge photoresist 41 contained in the bath 31 to the exterior.

The first drain pipe 53 has a first shut-off valve 57 for controlling photoresist flow in the first drain pipe 53, and the second drain pipe 55 has a second shut-off valve 59 for controlling photoresist flow in the second drain pipe 55.

According to the photoresist coating apparatus of the present invention, photoresist introduced into the bath during a photoresist coating process flows into the storage tank 51 through the first drain pipe 53 and is temporarily stored in the storage tank 51. At this time, an amount of photoresist introduced into the storage tank 51 is adjusted by means of the first shut-off value 53, so backflow of photoresist can be prevented. In addition, an electric signal generated when the vacuum chuck 33 rotates at a high speed is synchronized with the first shut-off valve 57, in such a manner that the first shut-off valve 57 is opened or closed depending on the rotation of the vacuum chuck 33.

Photoresist contained in the storage tank 51 is discharged to the exterior through the second drain pipe 55. At this time, if discharge pressure of the first and second drain pipes 53 and 55 increases, photoresist may be easily discharged to the exterior.

Figure 4:
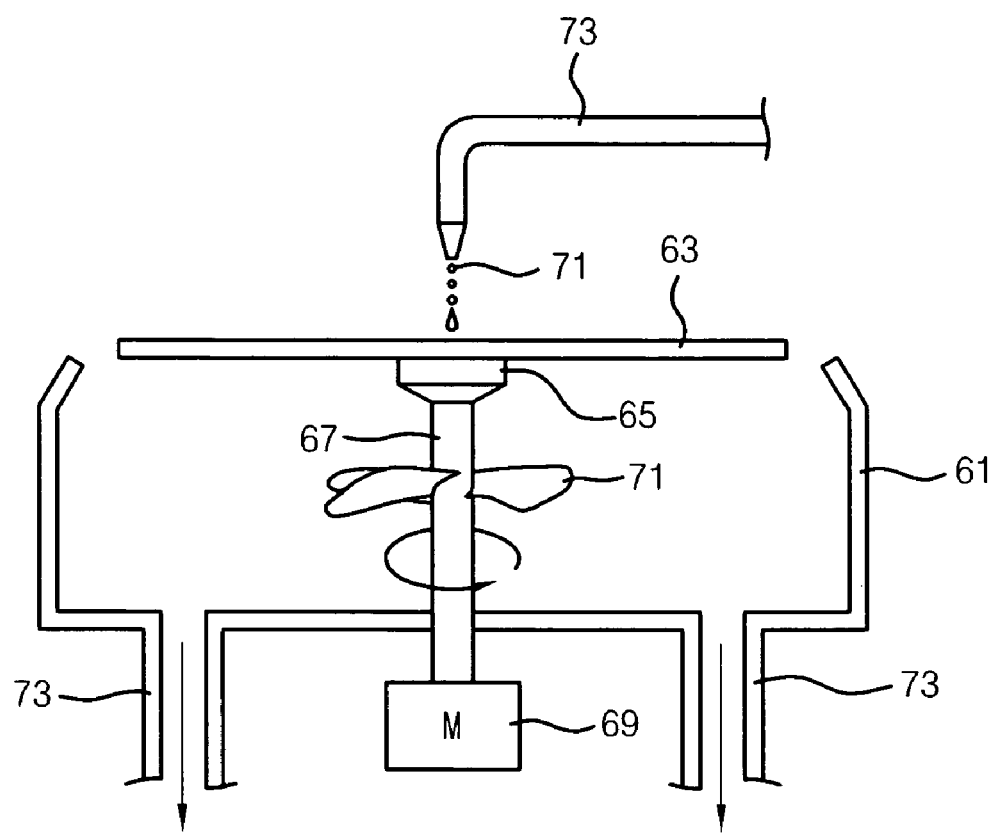
FIG. 4 is a schematic view showing a photoresist coating apparatus according to one embodiment of the present invention.

FIG. 4 is a schematic view showing a photoresist coating apparatus according to another embodiment of the present invention.

As shown in FIG. 4, the photoresist coating apparatus according to another embodiment of the present invention includes a vacuum chuck 65 capable of holding a substrate 36 by using vacuum, a driving motor 69 connected to the vacuum chuck 65 through an arm 67 in order to supply rotational driving force to the substrate 63, a first nozzle 73 installed above the vacuum chuck 65 in order to coat photoresist 71 onto the substrate 63, a spray-type second nozzle (not shown) installed below the vacuum chuck 65 in order to perform a rinse process with respect to a rear surface of the substrate 63, a bath 61 surrounding the vacuum chuck 65 including the substrate 33 in order to prevent photoresist 71 from being discharged to an exterior, a drain pipe 73 connected to both lower ends of the bath 61 in order to discharge photoresist contained in the bath 61, and a photoresist discharge section for forcibly discharging photoresist 71 contained in the bath 61 to the exterior.

The photoresist discharge section includes a rotating member 71 in the form of a vane coupled with the arm 67. As arm 67 rotates, the rotating member 71 is simultaneously rotated while developing wings thereof at a predetermined angle so that photoresist contained in the bath is forcibly discharged to the drain pipe 73.

In the photoresist coating apparatus according to another embodiment of the present invention, when photoresist is coated on an upper surface of the substrate, the arm 67 and the rotating member 71 are rotated at a high speed together with the vacuum chuck 65. At this time, wings of the rotating member 71 in the form of the vane are developed at a predetermined angle such that forcible air flow may create toward the drain pipe 73, thereby allowing photoresist to be easily discharged while removing a contamination source. In addition, the drain pipe 73 includes a cylindrical pipe such that air flow is constantly maintained when the rotating member 71 rotates. Meanwhile, when the rotating member 71 rotates, the wings are developed at an angle of about 15 to 60°.

According to the present invention, the storage tank described in the first embodiment may be provided with the rotating member described in the second embodiment. In this case, photoresist contained in the bath can be more easily discharged to the exterior.

According to the present invention, the photoresist discharge section is connected to a lower end of the bath in order to forcibly discharge photoresist to the exterior, thereby preventing photoresist from flowing backward while removing the contamination source.

As described above, according to the present invention, the photoresist storage tank is connected to the lower end of the bath and photoresist contained in the bath is forcibly discharged to the photoresist storage tank, thereby preventing photoresist from flowing backward. Therefore, defect caused by the contamination source can be removed, so the pattern bridge phenomenon can be prevented.

In addition, the rotating member in the form of a vane is coupled with the arm of the vacuum chuck such that the rotating member rotates at a high speed as the vacuum chuck rotates. Thus, photoresist is forcibly introduced into the drain pipe, so the contamination source can be removed, so that the pattern bridge phenomenon can be prevented.

Therefore, the present invention does not create the pattern bridge phenomenon, so a yield rate of semiconductor devices can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An apparatus for coating photoresist on a surface of a substrate during a semiconductor device manufacturing process, the apparatus comprising:
   a vacuum chuck capable of holding a substrate thereon by using vacuum;
   a driving motor connected to the vacuum chuck through an arm in order to supply rotational driving force to the substrate;
   a first nozzle installed above the vacuum chuck in order to coat photoresist onto the substrate;
   a second nozzle installed below the vacuum chuck in order to perform a rinse process with respect to a rear surface of the substrate;
   a bath surrounding the vacuum chick including the substrate in order to prevent photoresist from being discharged to an exterior;
   a first drain pipe connected to both lower ends of the bath in order to discharge photoresist contained in the bath;
   a vane, coupled to said arm, forcing air in said bath toward said first drain pipe; and
   a photoresist discharge section coupled to said first drain pipe to temporarily store photoresist introduced into the bath.

2. The apparatus as claimed in claim 1, wherein the photoresist discharge section includes a storage tank connected to the first drain pipe in order to temporarily store photoresist introduced into the bath, a second drain pipe connected to a lower end of the storage tank, and first and second shut-off valves for opening/closing the first and second drain pipe.

3. The apparatus as claimed in claim 2, wherein an opening/closing operation of the first shut-off valve is controlled by means of a synchronized signal created according to a rotation of the vacuum chuck.

4. The apparatus as claimed in claim 1, wherein the vane coupled to said arm, is simultaneously rotated as the arm rotates, said vane having wings thereof at a predetermined angle so that photoresist contained in the bath is forcibly discharged to the drain pipe.

5. The apparatus as claimed in claim 4, wherein the wings of the rotating member are developed at an angle of about 15 to 60°.

6. The apparatus as claimed in claim 1, wherein the second nozzle includes a spray-type nozzle.

* * * * *